United States Patent
Jones et al.

(10) Patent No.: US 9,267,965 B2
(45) Date of Patent: Feb. 23, 2016

(54) FLEXIBLE TEST SITE SYNCHRONIZATION

(71) Applicant: Advantest Corporation, Tokyo (JP)

(72) Inventors: Michael Jones, San Carlos, CA (US);
Takahiro Yasui, Gunma (JP); Alan S. Krech, Jr., Fort Collins, CO (US);
Edmundo Delapuente, Cupertino, CA (US); Taichi Fukuda, Isesaki (JP)

(73) Assignee: ADVANTEST CORPORATION, Tokyo (JP)

( * ) Notice: Subject to any disclaimer, the term of this patent is extended or adjusted under 35 U.S.C. 154(b) by 227 days.

(21) Appl. No.: 14/084,028

(22) Filed: Nov. 19, 2013

(65) Prior Publication Data
US 2015/0137839 A1  May 21, 2015

(51) Int. Cl.
*G01R 31/00* (2006.01)
*G01R 1/00* (2006.01)

(52) U.S. Cl.
CPC . *G01R 1/00* (2013.01); *G01R 31/00* (2013.01)

(58) Field of Classification Search
CPC .................................. G01R 1/00; G01R 31/00
USPC .................. 324/750.01–750.3, 762.01–762.1
See application file for complete search history.

(56) References Cited

U.S. PATENT DOCUMENTS

| | | | | |
|---|---|---|---|---|
| 6,032,271 A | * | 2/2000 | Goodrum | G06F 11/2005 710/100 |
| 7,506,228 B2 | * | 3/2009 | Pedersen | G01R 31/31725 324/750.03 |
| 2009/0307473 A1 | * | 12/2009 | Miller | G06F 9/3855 712/245 |
| 2011/0225256 A1 | * | 9/2011 | Seigneret | G06F 9/4843 709/207 |

* cited by examiner

*Primary Examiner* — Arleen M Vazquez
*Assistant Examiner* — Robert P Alejnikov, Jr.

(57) ABSTRACT

A method for performing test site synchronization within automated test equipment (ATE) is presented. The method comprises controlling a plurality of test program controllers (TPCs) using a plurality of bridge controllers (BCs), wherein each TPC can initiate multiple asynchronous events. For an asynchronous event initiated by a TPC, raising a busy flag while the asynchronous event is not yet complete and de-asserting the busy flag when the asynchronous event is complete, wherein the asynchronous event corresponds to a task requiring an indeterminate amount of time. It also comprises generating a busy signal in the first BCs in response to receiving a busy flag from any of the plurality of TPCs, wherein the busy signal remains asserted while any of the plurality of TPCs asserts a busy flag. Finally, it comprises transmitting the busy signal to the plurality of TPCs, wherein the TPCs use the busy signal to synchronize operations.

24 Claims, 6 Drawing Sheets

FLEXIBLE TEST SITE SYNCHRONIZATION

FIELD OF THE INVENTION

Embodiments of the present invention relate generally to automated device testing and more specifically to synchronization methods for automated device testing.

BACKGROUND OF THE INVENTION

Automated test equipment (ATE) can be any testing assembly that performs a test on a device, semiconductor wafer or die, etc. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor. Automatic Test Equipment (ATE) is commonly used within the field of electrical chip manufacturing. ATE systems both reduce the amount of time spent on testing devices to ensure that the device functions as designed and serve as a diagnostic tool to determine the presence of faulty components within a given device before it reaches the consumer.

In testing devices or products, e.g. after production, it is crucial to achieve among others a high product quality, an estimation of the device or product performance, a feedback concerning the manufacturing process and finally a high customer contentment. Testing devices, e.g., NAND flash packages requires some type of error capture and analysis. Usually a plurality of tests is performed in order to ensure the correct function of a device or product, commonly referred to as a device under test ("DUT") in testing parlance. The plurality of tests is typically part of a test plan or test program that is loaded into the ATE system by the user. The test plan acts as a blueprint for running the tests on the DUTs.

Conventional ATE solutions for testing DUTs are limited because the test program controllers control tester resources in a fixed way, with fixed synchronization mechanisms between them. Conventional ATE solutions, for example, do not allow for flexibility in assigning hardware units to DUTs, and furthermore, do not allow for flexibility in keeping the hardware units synchronized between each other. This inflexibility in assigning hardware units to a DUT and keeping them synchronized in a flexible fashion results in a lack of efficient use of tester resources.

BRIEF SUMMARY OF THE INVENTION

Accordingly, what is needed is an ATE system that provides an efficient, flexible and scalable solution for test pattern coordination across multiple test program controller units, each with different timing. In one embodiment, the present invention allows multiple test program controller units to be grouped and operate together as a combined resource in a way such that all the grouped resources operate in lockstep. For example, if any one of the controller units is performing an operation that takes an indeterminate amount of time, it is synced back together with the remaining resources after the operation is performed. The ability to group and synchronize the test resources allows the ATE system to be advantageously flexible and scalable because additional test resources can be added to a resource group seamlessly without expending effort in making sure they stay synchronized with the other resources in the group.

In one embodiment, a method for performing test site synchronization using automated test equipment (ATE) is disclosed. The method includes controlling a plurality of test program controllers (e.g. ASICs) using a bridge controller (e.g. an FPGA). Each test program controller can initiate multiple asynchronous events, wherein the asynchronous event corresponds to a task requiring an indeterminate amount of time. For every asynchronous event initiated by a test program controller, a busy flag is raised while the asynchronous event is not yet complete and de-asserted when the asynchronous event is complete. The method further includes generating a busy signal in the bridge controller in response to receiving a busy flag from any of the test program controllers, wherein the busy signal remains asserted by the bridge controller while any of the plurality of test program controllers asserts a busy flag. Finally, the method includes transmitting the busy signal to the plurality of test program controllers, wherein the test program controllers use the busy signal to synchronize operations and program flow.

In one embodiment, the bridge controller can be connected to other bridge controllers. In this embodiment, the method can also include transmitting the busy signal to the other bridge controllers connected to the first bridge controller. All the bridge controllers in such an embodiment are grouped together and operate as a single resource. The first bridge controller and the other bridge controllers use the busy signal to synchronize operations between each other.

In another embodiment, a computer-readable storage medium having stored thereon, computer executable instructions that, if executed by a computer system cause the computer system to perform a method performing test site synchronization using automated test equipment (ATE. The method includes controlling a plurality of test program controllers using a first bridge controller, wherein each test program controller can initiate multiple asynchronous events. For an asynchronous event initiated by a test program controller, raising a busy flag while the asynchronous event is not yet complete and de-asserting the busy flag when the asynchronous event is complete, wherein the asynchronous event corresponds to a task requiring an indeterminate amount of time. The method further includes generating a busy signal in the first bridge controller in response to receiving a busy flag from any of the plurality of test program controllers, wherein the busy signal remains asserted while any of the plurality of test program controllers asserts a busy flag. Finally, the method includes transmitting the busy signal to the plurality of test program controllers, wherein the test program controllers use the busy signal to synchronize operations and program flow.

In a different embodiment, a system for performing test site synchronization using automated test equipment (ATE) is disclosed. The system includes a plurality of test program controllers, wherein the test program controllers are operable to execute a test program on a plurality of connected devices under test (DUTs). It also includes a plurality of bridge controllers, wherein the plurality of bridge controllers and the plurality of test program controllers are grouped together to operate as a combined test resource, wherein the plurality of bridge controllers are connected together in sequence as a chain, wherein each bridge controller controls a subset of the plurality of test program controllers, and wherein each of the plurality of bridge controllers is operable to: (a) generate a busy signal in response to busy flag received from a test program controller connected to a respective bridge controller, wherein the busy flag is raised by an asynchronous event initiated by the test program controller, and wherein each asynchronous event corresponds to a task requiring an indeterminate amount of time; (b) transmit a first busy signal downstream serially to subsequent bridge controllers in the chain, wherein the first busy signal gathers information regarding respective busy statuses of the plurality of bridge controllers; (c) propagate a second busy signal upstream to prior bridge controllers in the chain, wherein the second busy signal is generated from the first busy signal, wherein the second busy signal includes combined information regarding respective busy statuses of each of the plurality of bridge controllers, and wherein the second busy signal distributes the information on its way upstream to each of the plurality of bridge controllers; and (d) transmit the second busy signal to a connected test program controller, wherein the second busy is operable to synchronize operations of the plurality of test program controllers.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Flexible Test Site Synchronization

In one embodiment, the present invention is an ATE system that provides an efficient, flexible and scalable solution for test pattern coordination across multiple test program controller units, each with different timing. Embodiments of the present invention allow multiple test program controller units to be grouped and operate together as a combined resource in a way such that all the grouped resources operate in lockstep. For example, if any one of the test program controller units is performing an operation that takes an indeterminate amount of time, it is synced back together with the remaining resources after the operation is performed. Synching the grouped resources is important because certain operations, e.g., programming a new test pattern on connected DUTs needs to happen in sync for all the resources in a group. The ability to group and synchronize the test resources allows the ATE system to be advantageously flexible and scalable because additional test resources can be seamlessly added to the group without expending effort in making sure they stay synchronized with the other resources in the group.

Figure 1:
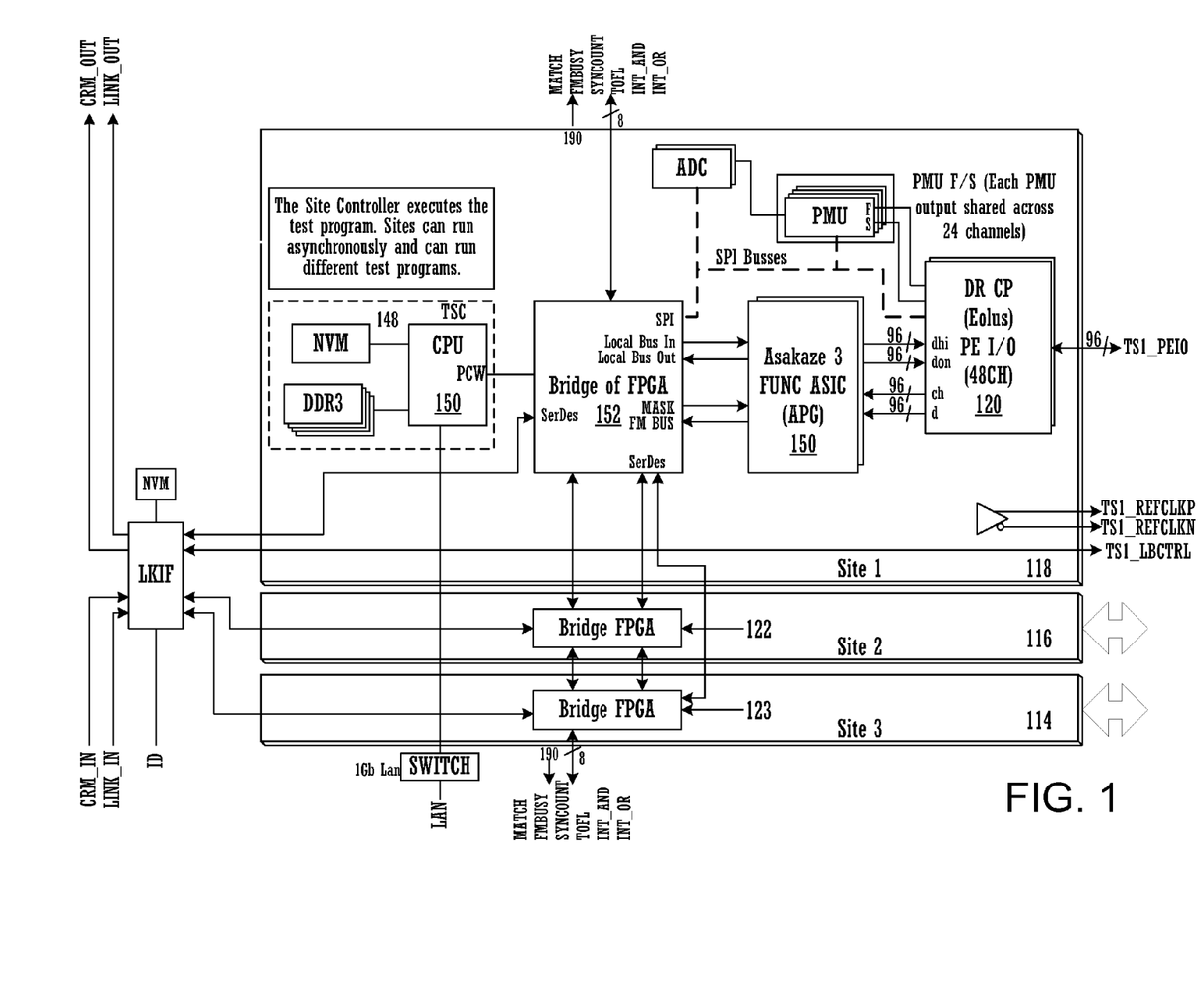
FIG. 1 illustrates a block diagram of the Pin Electronics Module (PEM) of the ATE apparatus in accordance with one embodiment of the present invention.

FIG. 1 illustrates a block diagram of the Pin Electronics Module (PEM) of the ATE apparatus in accordance with one embodiment of the present invention. In one embodiment, a PEM is a test instrument or printed circuit board (PCB) including test sites, 118, 116 and 114. Further, in one embodiment, each test site can include two independent test program controllers 150 (hereinafter referred to as "ASICs"), however, in other embodiments any number of ASICs can be configured onto a single test site. Typically the tester hardware has all the resources divided up evenly between the various test sites so that each site can have access to resources such as pin electronics, power supplies, memories etc. All the resources are controlled by the ASICs and/or FPGAs, each of which can operate as an independent unit. The ASIC, in one embodiment, is a processor that runs the test program and generates and verifies test patterns for the connected DUTs.

Further, in one embodiment, each test site can include a Bridge FPGA. For example, test site 118 includes Bridge FPGA 152, while test sites 116 and 114 include Bridge FPGAs 122 and 123 respectively. In other embodiments, each test site can include more than a single Bridge FPGA. In one embodiment of the present invention, each test site also includes a test site controller module 148. Test site controller module 148 can include a test processor 150.

Each of the test sites, for example test site 118, can include two Pin Electronics (PE) I/O modules 120, through which each ASIC on the test site can connect to and test one or more DUTs (not shown) in parallel. In one embodiment, each PE I/O module 120 can include as many as 48 channels for connecting to and testing DUTs. For example, test site 118 may test 8 DUTs in parallel through PE I/O module 120, wherein each DUT requires up to 8 channels to communicate with ASIC 150. In this example, 64 of the available 96 channels (48×2) will be utilized by the 8 DUTs communicating with test site 118.

In another embodiment, multiple consecutive ASICs from multiple test sites may be grouped together in Combined Resource Mode (CRM). Combining the ASICs into a CRM group allows for flexible allocation of tester resources to test DUTs, each type of which may have different resource needs. For example, if a DUT requires 120 channels to communicate with test site 118, up to 3 ASICs with a combined I/O capability of 144 channels (48×3) may need to be grouped together as a CRM group to test the DUT. Signal FMBUSY 190, shown in FIG. 1, can be used by all the resources within CRM groups to stay synchronized so that they can act in a highly coordinated fashion to execute the DUT test program.

Test data can be received from connected DUTs (not shown) through PE I/O module 120. ASICs 150 conveys information captured from the DUTs to Bridge FPGA module 152. The test data is processed and compressed by ASICs 150 and FPGA module 152, and the fail information extracted from the test data is conveyed to test site controller module 148.

In one embodiment, Bridge FPGA module 152 can process and analyze the data from the ASICs 150 in real time. For example, the FPGA module 152 can, among other things, compress and synthesize error related information that cannot be corrected in software into convenient fail lists for each connected DUT. Finally, the test site controller module 148, in one embodiment, is configured to gather the fail lists communicated by the FPGA module 152 and analyze the information to provide a corrective solution.

Figure 2:
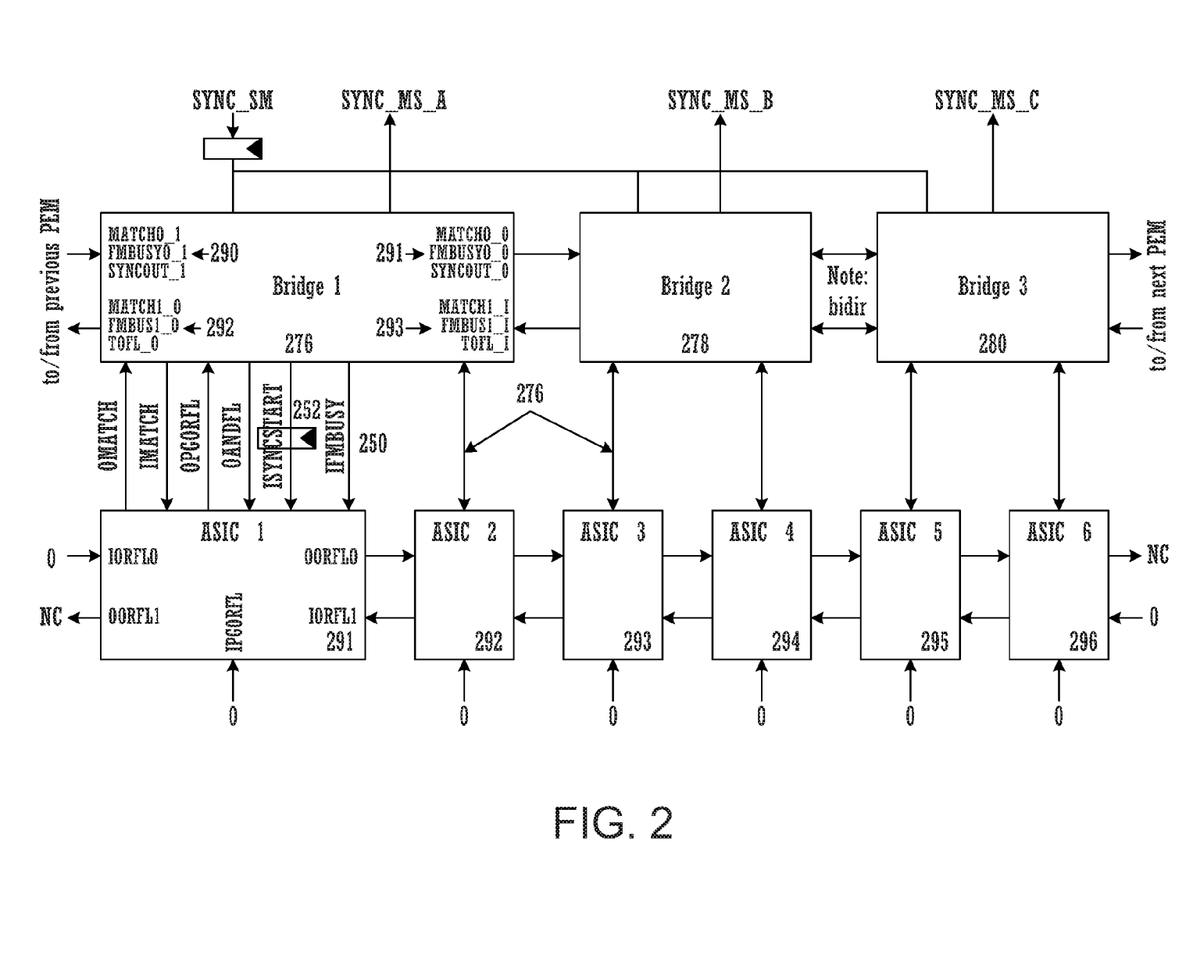
FIG. 2 illustrates a block diagram showing the interconnections between the Bridge Field Programmable Gate Arrays (FPGAs) and the Application Specific Integrated Circuits (ASICs) in a PEM in accordance with one embodiment of the present invention.

FIG. 2 illustrates a block diagram showing the interconnections between the Bridge Field Programmable Gate Arrays (FPGAs) and the Application Specific Integrated Circuits (ASICs) in a PEM in accordance with one embodiment of the present invention. As discussed above, a PEM is a test instrument that, in one embodiment, includes 6 independent ASICs 291-296, pairs of which connect to a single controller, the Bridge FPGA. Accordingly, each PEM can include 3 Bridge FPGAs, 276, 278 and 280.

As discussed above, while the ASICs can run independently of each other, they can also be grouped together in a CRM for certain applications, e.g., testing of DUTs that require more than 48 I/Os. For example, a DUT requiring 120 I/O channels may need to straddle 3 ASICs. As a result, within a CRM group, multiple ASICs may need to be straddled to effectively act as a single ASIC module depending on the application. In one embodiment, the present invention allows a CRM group to include 1, 2, 3, 4, 6, or 12 ASICs and their associated resources. Accordingly, multiple Bridge FPGAs and even multiple PEMs can be grouped together to form a single CRM group. Further, the CRM mode is software programmable, and not hardwired, which makes scaling possible.

The CRM groups can function independently without the need for coordination between them. Although the CRM groups are independent, the ASICs within a group must be carefully synchronized, so they each act in a highly coordinated fashion to execute the DUT test program. The ASICs may fall out of sync because one of the ASICs may need to perform an operation that takes an indeterminate amount of time, e.g., loading Buffer Memory from an FPGA to an ASIC, asynchronous reads from certain registers, processing fail data from the DUTs, etc.

After performing such operations, however, the ASICs need to all be brought back into synchronization. Since some of the ASICs within a CRM group may be physically separated from the other ASICs, it is especially important to ensure that resources from all the respective sites are properly synchronized. Synchronization between the ASICs is important because even though the ASICs can run independently from each other, when combined into a CRM group, they need to initiate certain operations, e.g., executing a new pattern at the same time and in sync. Accordingly, the present invention has the advantage of flexibly scaling test pattern coordination across multiple ASICs, each with different timing.

In one embodiment, the Bridge FPGAs within a CRM group are kept in sync by propagating the FMBUSY signal through the chain of FPGAs within the CRM group. For example, if Bridges 276, 278, and 280 and ASICs 291-296 were part of the same CRM group (e.g. operating in CRM 6 with 3 Bridge FPGAs and 6 ASICs), the FMBUSY signal would need to be propagated to all the resources within the CRM 6 group to ensure that they were operating in lockstep. In other words, every test resource within a CRM group needs to know if all the other test resources in that group are ready to start a new operation. If any of the test resources are performing an operation that is asynchronous or takes an indeterminate amount of time, the other test resources need to wait for it to get back in sync.

In the embodiment discussed above, Bridge FPGA 276, similar to the other Bridge FPGAs, includes an input port, FMBUSY0_I 290 for an incoming FMBUSY signal. The FMBUSY signal is OR-ed internally with the busy status of the current FPGA 276, and propagated to the subsequent Bridge FPGA 278 in the CRM 6 chain using output signal port FMBUSY0_O 291. Similar to Bridge FPGA 276, FPGAs 278 and 280 receive information regarding the busy statuses of FPGAs prior to them in the CRM 6 chain through their respective FMBUSY0_I ports. That information is OR-ed with the busy status of the current respective FPGA and outputted through the respective FMBUSY0_O port. Once, the busy information has been propagated from Bridge 276 down to Bridge 280, it must also be cycled back so that the earlier FPGAs in the chain, e.g., Bridge 276 and 278, receive information regarding the busy status of the later FPGAs, e.g., Bridge 280 in the chain. The FMBUSY1_I port 293 on each Bridge FPGA receives the FMBUSY signal from later FPGAs in the chain. The signal is then propagated further upstream from each FPGA using FMBUSY1_O port 292.

The FMBUSY signal also needs to be communicated to the ASICs 291-296 in the CRM 6 group to keep the ASICs in sync with the other test resources. In one embodiment, as will be discussed further below, signal IFMBUSY 250 transmitted from a Bridge FPGA, e.g. FPGA 276, to an ASIC, e.g., ASIC 291, carries the FMBUSY signal from the Bridge FPGA to the ASIC and allows this synchronization to take place. Signal groups 255 replicate the set of signals exchanged between Bridge 276 and ASIC 291. Further, an ISYNCSTART 252 signal communicated to the ASIC can also help with this synchronization. Accordingly, all the bridges communicate an ISYNCSTART signal and an IFMBUSY signal to their respective connected ASICs.

In one embodiment, the ASICs can execute a specific operation code (op-code) called a JBF instruction while it waits for the IFMBUSY signal to be de-asserted before it continues execution of further patterns. In other words, when an ASIC initiates an asynchronous operation that will cause FMBUSY to be asserted, it will execute a JBF instruction, which will wait for the IFMBUSY signal returning back to the ASIC to be de-asserted before it passes control to subsequent instructions. Additionally, all the ASICs in a CRM need to exit their respective JBF instructions within one clock period so they can stay synchronized when new test patterns are run.

The FMBUSY signal may be asserted as a result of any one of multiple asynchronous events, examples of which will be discussed in reference to FIG. 4. Each of the events is initiated typically by an ASIC in the CRM group and takes an indeterminate amount of time. The FMBUSY signal is generated by the logic within the Bridge FPGA that is controlling the asynchronous events. The FMBUSY signal is distributed back to the ASICs in a controlled fashion and allows the program within each ASIC to wait until all ASICs have completed certain actions and are ready for the test program to continue. By this means, the programs in all ASICs remain in alignment with each other.

The CRM is software programmable and, in one embodiment, the Bridge FPGAs include circuitry to allow the system to be programmed in any one of several CRMs. Depending on the CRM (e.g., 1, 2, 3, 4, 6, 12, etc.) then, the Bridge FPGAs will generate sync signals, e.g., ISYNCSTART and IFMBUSY to the respective ASICs in the CRM group so that all the operations of the ASICs within the CRM group stay aligned.

Figure 3:
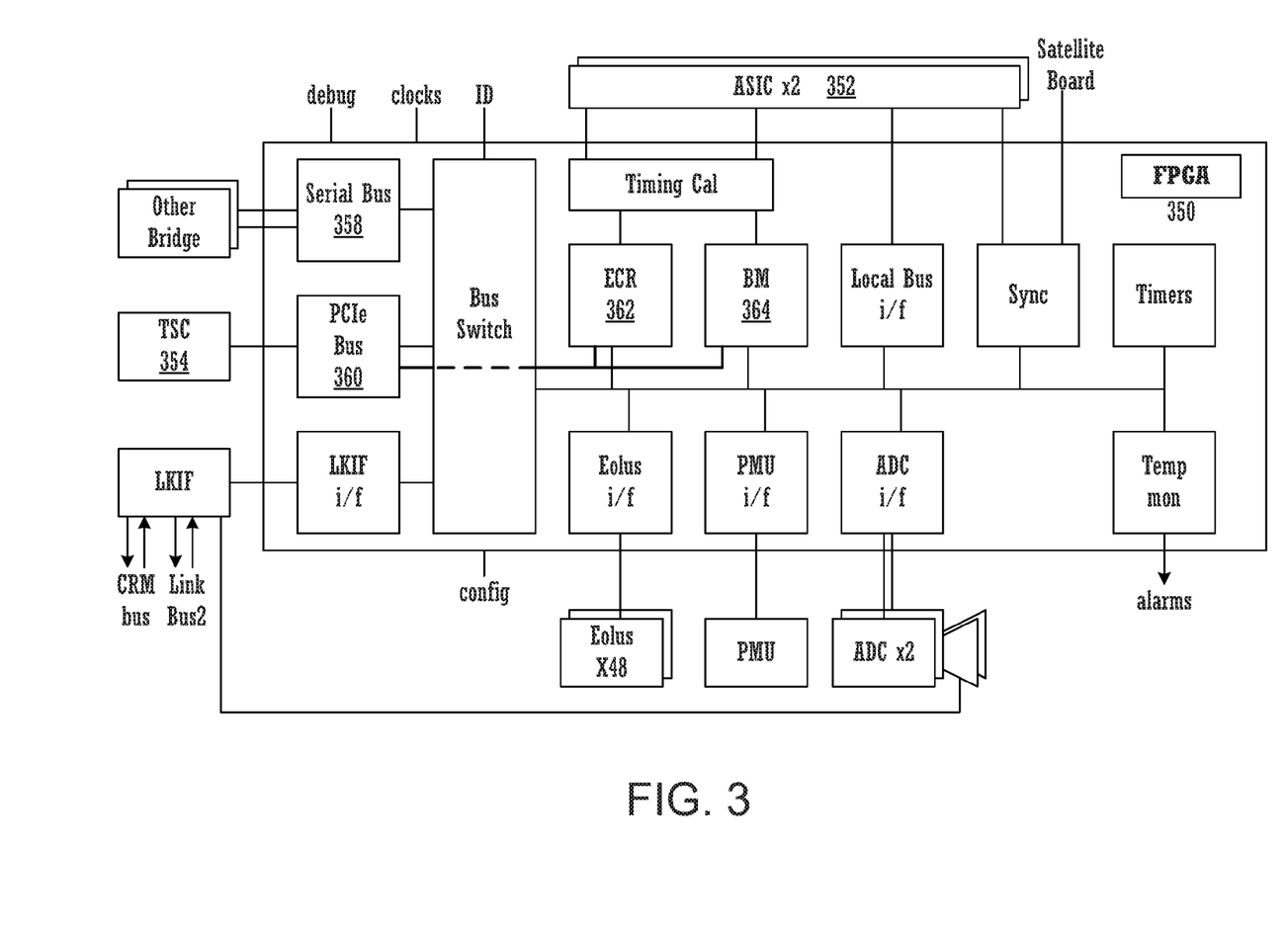
FIG. 3 illustrates a block diagram of the Bridge Field Programmable Gate Array (FPGA) module from FIG. 3 in accordance with one embodiment of the present invention.

FIG. 3 illustrates a block diagram of the Bridge Field Programmable Gate Array (FPGA) module from FIG. 1 in accordance with one embodiment of the present invention. As discussed above, the Bridge FPGA 350 may be connected to 2 ASIC modules 352 in one embodiment. Test data is received from ASICs 352, processed by FPGA 350, and transmitted to Test Site Controller (TSC) 354 through a PCIe Bus module 360.

Buffer memory (BM) module 364 can be used, in one embodiment, to store data expected to be read out from any connected DUTs. The expected data from BM module 364 is transmitted to the connected ASICs, where it is compared with data from incoming DUTs to identify the points of failure in the DUTs. Error Catch RAM (ECR) module 362 processes the fail data from the ASICs 352. The resulting data is formed into a Fail List, which is passed to TSC 354 using Direct Memory Access (DMA).

Figure 6:
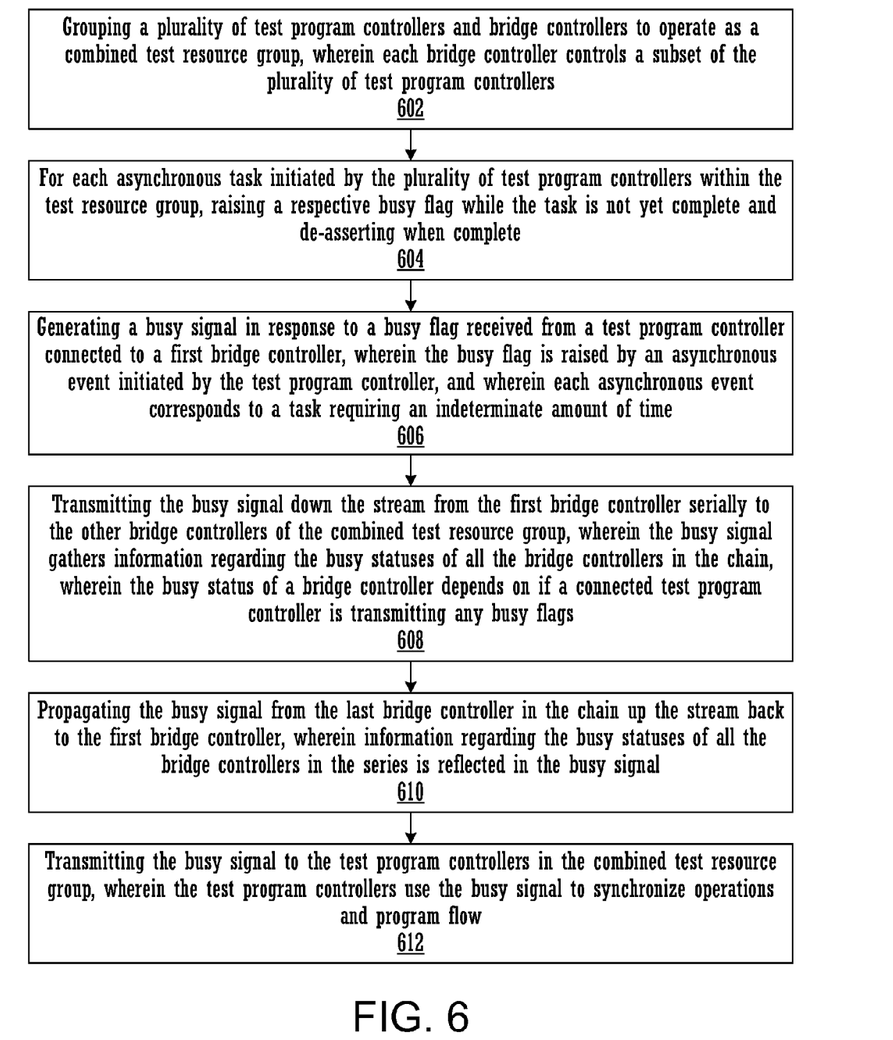
FIG. 6 depicts a flowchart of an exemplary computer controlled process for performing test site synchronization is disclosed in accordance with one embodiment of the present invention.

The FMBUSY signal, as will be further described in reference in to FIG. 6, can be used, among other things, to prevent pattern transfers between the ASICs 352 and the ECR module 362, or between the ASICs 352 and BM module 364, while a page transfer is in progress or there is insufficient room for the next transfer.

Figure 4:
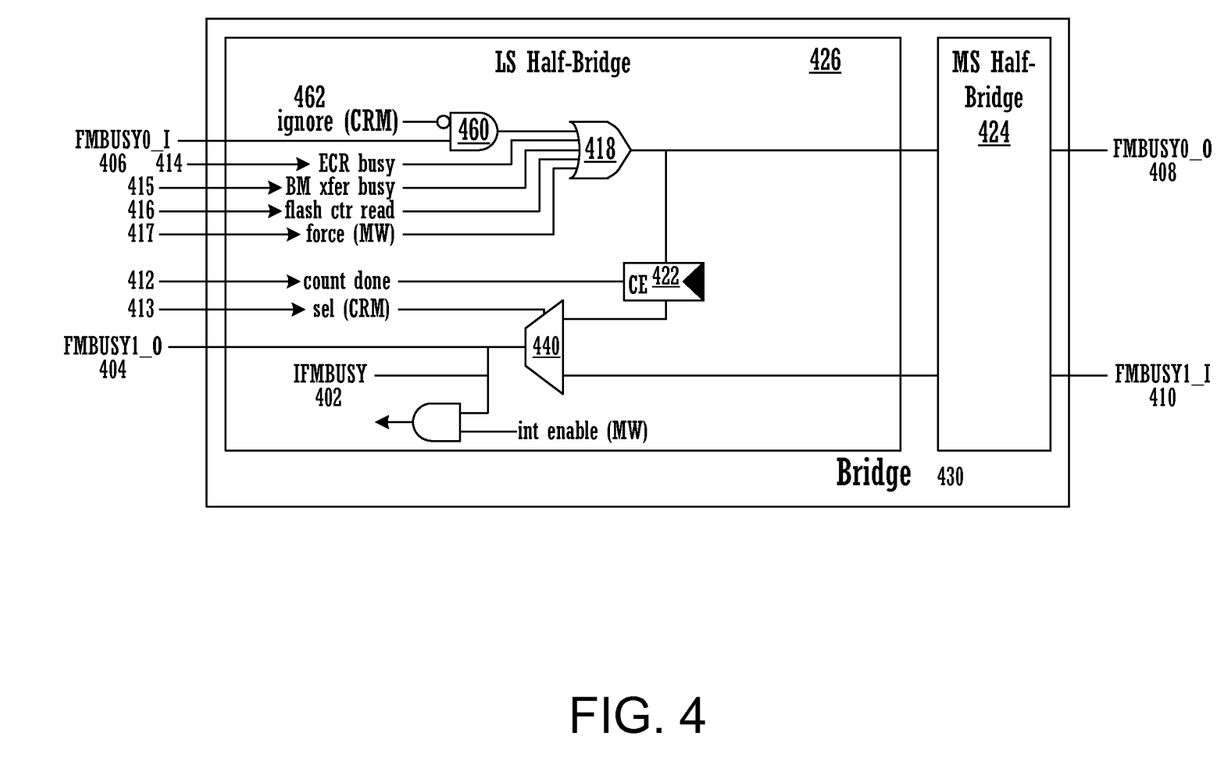
FIG. 4 illustrates a block diagram for an FPGA Half-Bridge, wherein a sync signal generated therein is used to synchronize the operation of a plurality of Bridge FPGAs and ASICs in a combined resource mode (CRM) group in accordance with one embodiment of the present invention.

FIG. 4 illustrates a block diagram for an FPGA Half-Bridge, wherein a sync signal generated therein is used to synchronize the operation of a plurality of Bridge FPGAs and ASICs in a combined resource mode (CRM) group in accordance with one embodiment of the present invention. Each Bridge FPGA 430, in one embodiment, includes two Half-Bridges, 424 and 426, wherein each Half-Bridge connects to and controls an ASIC. Allowing Bridge FPGAs to be split into two internally allows for odd-numbered CRM groups, e.g., CRM 3, wherein two of the ASICs connect to a full Bridge FPGA and the third ASIC connects to a Half-Bridge.

The FMBUSY sync signal is received into Half-Bridge 426 via the FMBUSY0_I input port 406. The FMBUSY sync signal is then transmitted through AND gate 460, wherein the AND gate 460 is also controlled by CRM signal 462. CRM signal 462 in conjunction with the select CRM signal 413 delineate the CRM group. The Half-Bridge 426 combines the busy signals by OR-ing the contributing sources, 414-417, with the incoming FMBUSY signal received through port 406 using OR gate 418 before sending out the combined FMBUSY signal through FMBUSY0_O output port 408. Some examples of the contributing sources are signals ECR busy 414, BM xfer busy 415, and flash ctr read 416. These are examples of flags that are raised in the ASICs and communicated to their respective Half-Bridge to indicate the initiation of asynchronous operations. However, it should be noted that there may be many other cases for which an FMBUSY signal may need to be asserted.

The combined FMBUSY signal is distributed through other connecting Bridge FPGAs in the CRM and combined with the busy statuses of the other FPGAs further down the chain before it is looped back around and received by Half-Bridge 426 through FMBUSY1_I port 410. The FMBUSY signal can then be propagated further up the chain through FMBUSY1_O port 404. Stated differently, the Bridge FPGA combines the Busy signals by OR-ing all the contributing sources. The result is passed to the next Bridge using the FMBUSY0 chain and the final Bridge propagates the result using the FMBUSY1 chain.

As stated above, the FMBUSY signal may be asserted in response to multiple events, each of which is initiated by the ASIC. The test program includes a series of patterns that are executed by the ASIC. All the test processes are triggered by one of the patterns executed by the ASIC. Occasionally, the ASIC executes a pattern that is asynchronous or takes an indeterminate amount of time. The FMBUSY signal is generated by the logic within the Bridge FPGA that is controlling the asynchronous events. For example, it is in response to a pattern executed by the ASIC that buffer memory from BM module 364 is loaded into the ASIC. However, this is an asynchronous operation and is not done in real time. As a result, pattern continuation from the ASIC is held up until the transfer is complete by asserting the BM xfer busy 415 signal as shown in FIG. 4, which in turn asserts the FMBUSY signal within Half-Bridge 426 at the output of OR-gate 418. Because different Bridge FPGAs within a CRM may finish loading data from BM module 364 into the respective ASIC at different times, it is necessary to use the FMBUSY signal to get the patterns back in sync before continuing with the remainder of the test program.

Also, the ASIC executes a pattern for transferring fail data to the Bridge FPGA. As discussed above, ECR module 362 within the Bridge FPGA processes the fail data from the ASICs 352. The ECR busy signal 414 is used to assert the FMBUSY signal so as to prevent the pattern from an ASIC continuing while a page transfer is in progress or there is insufficient room for the next transfer. The ECR busy signal 414, therefore, asserts the FMBUSY signal during a transfer from the ASIC to the Bridge and keeps FMBUSY asserted until there is sufficient room in the fail buffer of the ECR pipeline to accept the next full page of fail data.

In one embodiment, the ASICs include a Flash Counter, which is a test specific counter. It can be read back using a relatively slow speed register access bus that connects a Bridge FPGA to the ASIC. The timing of this bus can be indeterminate. The Flash Counter value can be read back on-the-fly, triggered at a user-programmable point in the test pattern. To ensure the value read is stable, the pattern being executed by the ASIC needs to be stopped until this read-back has completed. Accordingly, in one embodiment, flash ctr read signal 416 can be asserted during the read-back, which in turns asserts the FMBUSY Signal. Once the read-back is completed, the ASIC pattern is allowed to continue, in lock-step on all ASICs.

Force signal 417 can, in one embodiment, be a diagnostic force signal that asserts FMBUSY signal during testing.

As discussed above, the FMBUSY signal is distributed back to the ASICs in a controlled fashion and allows the program within each ASIC to wait until all ASICs have completed the asynchronous or indeterminate operations and are ready for the test pattern to continue. By this means, the programs in all ASICs remain in alignment with each other. Further, allowing the various ASICs and Bridges within a CRM group to align with one another prior to executing a test pattern is a necessary prerequisite for synchronized operation within a CRM group.

The FMBUSY signal is propagated by Half-Bridge 426 to its connected ASIC using IFMBUSY signal 402. In one embodiment, multiplexer 440 in conjunction with select CRM signal 413 determines to which CRM group the Half- Bridge 426 belongs. Similarly, the multiplexer and select CRM signal in Half-Bridge 424 determine to which CRM group the next Half-Bridge in the chain belongs. In other words, the select CRM signal 413 controls where the loop-back of the FMBUSY signal in the CRM chain occurs.

IFMBUSY signal 402 is generated by sampling the FMBUSY signal at the output of OR gate 418 and clocking it through flip-flop 422 and then propagating through the FMBUSY1 chain. Flip-flop 422 is, however, only periodically sampled so that all the ASICs in the CRM receive the updated value of FMBUSY signal at the same sub-sampled period. Because FMBUSY is propagated through the chain of Bridges in the CRM group, it does not reach every test resource within the CRM group at the same time because of the time delay associated with the propagation of the signal. Using the count-done clock divider signal 412, as shown in FIG. 4, flip-flop 422 is under-sampled to make sure that all ASICs receive the FMBUSY signal transition within one sub-sampled period at most. The value of the clock-divider that generates count-done signal 412 is programmable and will depend on the length of the CRM chain. The longer the CRM chain, the longer it will take for FMBUSY to propagate through the various Bridges, and the higher the count value will need to be to make sure that the ASICs are aligned. In one embodiment, a divider value of 16 or 32 can be used, which ensures that at least 16 or 32 clock cycles respectively will transpire in between sampling FMBUSY to allow the signal enough time to propagate around the CRM chain.

Figure 5:
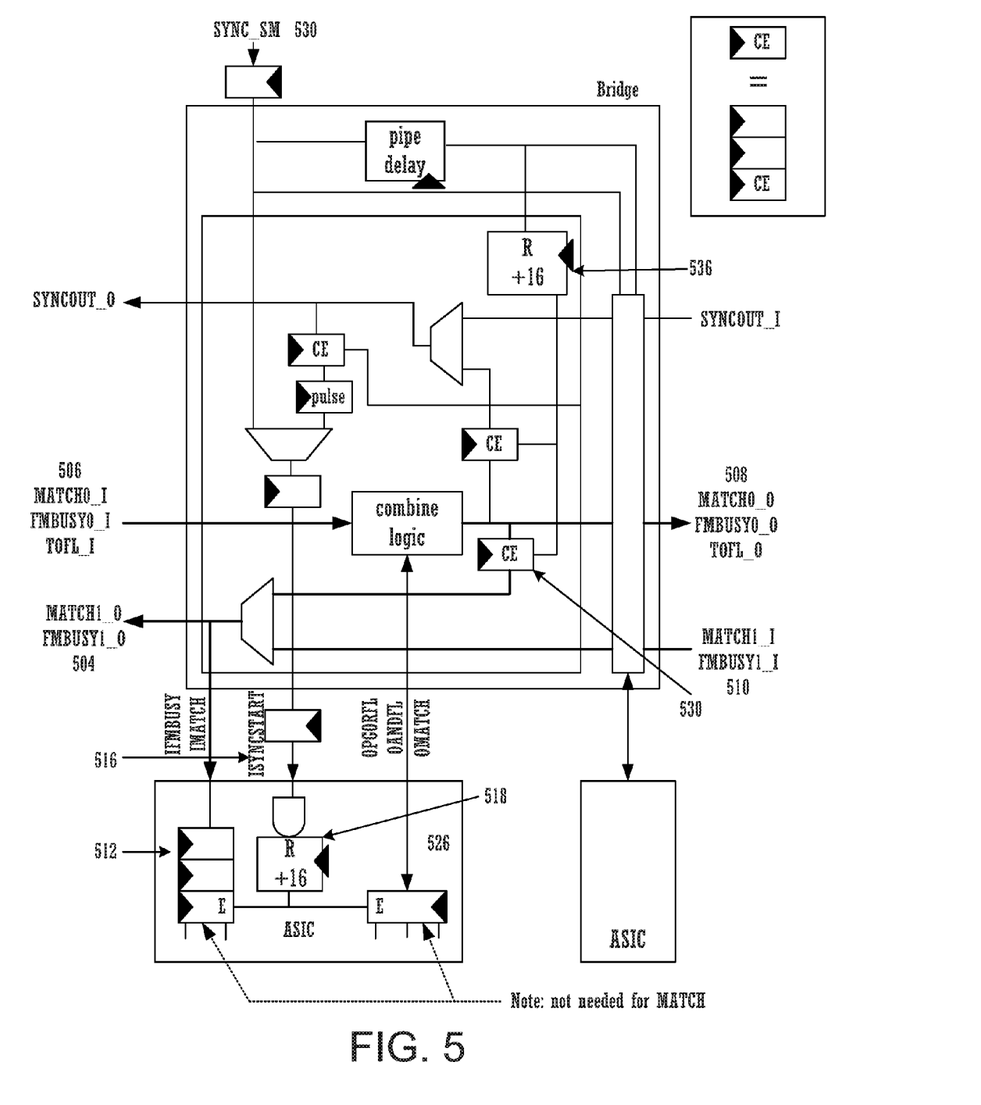
FIG. 5 illustrates a block diagram showing how the sync signal from FIG. 4 is under-sampled in order to ensure that all the Bridge FPGAs and ASICs within the CRM chain are kept in lockstep in accordance with one embodiment of the present invention.

FIG. 5 illustrates a block diagram showing how the sync signal from FIG. 4 is under-sampled in order to ensure that all the Bridge FPGAs and ASICs within the CRM chain are kept in lockstep in accordance with one embodiment of the present invention. FIG. 5 illustrates a Bridge wherein the FMBUSY signal is propagated using ports FMBUSY0_I 506, FMBUSY0_O 508, FMBUSY1_I 510, and FMBUSY1 O 504, similar in function to the ports described in relation to FIG. 4. As discussed above, the output of flip-flop 530 is used to gate when IFMBUSY signal reaches the ASIC. As discussed above, the ASIC will have executed the op-code JBF, in one embodiment, which waits for the IFMBUSY signal to be de-asserted. It is important that all ASICs exit their respective JBF instructions at the same time. Accordingly, it is important for all the ASICs in the CRM to act on the de-assertion of IFMBUSY at the same clock cycle. Similar to flip-flop 530, flip-flop 512 in ASIC 526 also is under-sampled based on a value from clock divider 518. The output of flip-flop 512 is used within the ASIC to control pattern execution. Clock divider 518 that gates flip-flop 512 is programmed with the same value as divider 536, which gates flip-flop 530. Clock divider 518 is implemented per half-bridge, in one embodiment, in order to provide more flexibility in performing counter resets.

Both clock-dividers 518 and 536 can, in one embodiment, be programmed with a value of 16 or 32, as discussed above, in order to make sure that at least 16 or 32 clock cycles transpire respectively before the FMBUSY signal is sampled by the ASICs. However, in order to ensure that all ASICs sample the FMBUSY at the same cycle within the 16 or 32 clock cycles, another signal SYNC_SM 530 is used. SYNC_SM 530 is evenly distributed to all tester resources so that it arrives at all the ASICs at the same time and, therefore, it can be used, among other things, to synchronize all ASICs to the same clock cycle. SYNC_SM 530 is used with the Bridge to reset divider 536. The SYNC_SM 530 signal is propagated to the ASICs through the FPGAs as ISYNC-START signal 516, wherein the ISYNCSTART signal 516 is operable to control the reset of the divider 518. Accordingly, SYNC_SM 530 is used in conjunction with FMBUSY to align the various ASICs within a CRM group to one another prior to executing a test pattern.

Without the use of the FMBUSY signal and the clock dividers, the ASICs would likely need to wait for a long indeterminate period for asynchronous operations to finish before starting a new test pattern. However, this is both inefficient and in some cases inaccurate, e.g., in the case of an asynchronous operation taking longer than anticipated. Embodiments of the present invention therefore allow for efficient test pattern coordination across multiple test program controller units, each with different timing.

FIG. 6 depicts a flowchart of an exemplary computer controlled process for performing test site synchronization is disclosed in accordance with one embodiment of the present invention. The invention, however, is not limited to the description provided by flowchart 600. Rather, it will be apparent to persons skilled in the relevant art(s) from the teachings provided herein that other functional flows are within the scope and spirit of the present invention. Flowchart 600 will be described with continued reference to exemplary embodiments described above though the method is not limited to those embodiments At step 602, a plurality of test program controllers and a plurality of bridge controllers are grouped together to operate as a combined test resource group. As discussed above, each bridge controller controls a subset of the test program controllers, e.g., each Bridge FPGA controls 2 ASICs as shown in FIG. 2.

At step 604, a busy flag is raised for each asynchronous task initiated by the test program controllers within the combined test resource group. The flag is kept raised while the task is not yet complete and is de-asserted when the task is complete.

At step 606, a busy signal is generated in one of the bridge controllers in response to a busy flag received from a test program controller. As discussed above, the busy flag is raised in response to an asynchronous event initiated by a test program controller. While the busy signal is generated within a Bridge FPGA, it is generated in response to flags raised and received from connected ASICs alerting the Bridge FPGA to an asynchronous event that was initiated in the respective ASIC. These asynchronous events typically take an indeterminate amount of time, which is why the busy signal of the present invention is required to bring the ASICs back in synchronization after the asynchronous events finish.

At step 608, the busy signal, e.g., the FMBUSY signal is transmitted down the stream from the first bridge controller serially to other bridge controllers of the combined test resource group, wherein the busy signal indicates the busy status of the first bridge controller, and wherein the busy signal combines information regarding the busy statuses of the other bridge controllers down the stream from the first bridge controllers as it is transmitted from one bridge controller to the other. As mentioned above, the busy status of a bridge controller depends on if the test program controllers connected to the bridge controller are running an asynchronous operation.

At step 610, the busy signal is then propagated from the last bridge controller in the combined test resource group chain up the stream back to the first bridge controller. The information regarding the respective busy statuses of all the bridge controllers is reflected in the busy signal and propagating it up the chain allows bridge controller further upstream in the chain to receive information regarding the busy statuses of all bridge controllers in the chain.

At step 612, busy signal is transmitted back down to the test program controllers connected to the bridge controllers and the information from the busy signal is used to synchronize operations and program flow of the test program controllers so that they can continue to execute a DUT test program in synchronized fashion. In one embodiment, the de-assertion of the busy signal is used by the test program controllers to resume test program execution in a synchronized way.

Embodiments according to the invention are thus described. While the present disclosure has been described in particular embodiments, it should be appreciated that the invention should not be construed as limited by such embodiments, but rather construed according to the below claims.

What is claimed is:

1. A method for performing test site synchronization using automated test equipment (ATE), the method comprising:
   controlling a plurality of test program controllers using a first bridge controller, wherein each test program controller can initiate multiple asynchronous events;
   for an asynchronous event initiated by a test program controller, raising a busy flag while the asynchronous event is not yet complete and de-asserting the busy flag when the asynchronous event is complete, wherein the asynchronous event corresponds to a task requiring an indeterminate amount of time;
   generating a busy signal in the first bridge controller in response to receiving a busy flag from any of the plurality of test program controllers, wherein the busy signal remains asserted while any of the plurality of test program controllers asserts a busy flag; and
   transmitting the busy signal to the plurality of test program controllers, wherein the test program controllers use the busy signal to synchronize operations and program flow.

2. The method of claim 1, further comprising:
   transmitting the busy signal to a plurality of bridge controllers connected to the first bridge controllers, wherein the busy signal is used to synchronize operations between the plurality of bridge controllers and the first bridge controller, and wherein the plurality of bridge controllers and the first bridge controller are grouped together and operate as a single resource.

3. The method of claim 1, further comprising:
   under-sampling the busy signal using a divider module, wherein the first bridge controller comprises a divider module; and
   propagating an under-sampled output of the busy signal from the first bridge controller to the plurality of test program controllers, wherein the under-sampled output of the busy signal is operable to synchronize operations and program flow between the plurality of test program controllers.

4. The method of claim 1, wherein a bridge controller comprises a Field Programmable Gate Array (FPGA) device.

5. The method of claim 1, wherein a test program controller comprises an Application Specific Integrated Circuit (ASIC).

6. The method of claim 1, wherein the asynchronous event is selected from a group consisting of: loading buffer memory into a test program controller, asynchronous reads by a test program controller from registers in a bridge controller, and processing fail data from connected DUTs.

7. A non-transitory computer-readable storage medium having stored thereon, computer executable instructions that, if executed by a computer system cause the
   computer system to perform a method performing test site synchronization using automated test equipment (ATE), the method comprising: controlling a plurality of test program controllers using a first bridge controller, wherein each test program controller can initiate multiple asynchronous events;
   for an asynchronous event initiated by a test program controller, raising a busy flag while the asynchronous event is not yet complete and de-asserting the busy flag when the asynchronous event is complete, wherein the asynchronous event corresponds to a task requiring an indeterminate amount of time;
   generating a busy signal in the first bridge controller in response to receiving a busy flag from any of the plurality of test program controllers, wherein the busy signal remains asserted while any of the plurality of test program controllers asserts a busy flag; and transmitting the busy signal to the plurality of test program controllers, wherein the test program controllers use the busy signal to synchronize operations and program flow.

8. The non-transitory computer-readable storage medium as described in claim 7, wherein the method further comprises:
   transmitting the busy signal to a plurality of bridge controllers connected to the first bridge controllers, wherein the busy signal is used to synchronize operations between the plurality of bridge controllers and the first bridge controller, and wherein the plurality of bridge controllers and the first bridge controller are grouped together and operate as a single resource.

9. The non-transitory computer-readable storage medium as described in claim 7, wherein the method further comprises:
   under-sampling the busy signal using a divider module, wherein the first bridge controller comprises a divider module; and
   propagating an under-sampled output of the busy signal from the first bridge controller to the plurality of test program controllers, wherein the under-sampled output of the busy signal is operable to synchronize operations and program flow between the plurality of test program controllers.

10. The non-transitory computer-readable storage medium as described in claim 7, wherein a bridge controller comprises a Field Programmable Gate Array (FPGA) device.

11. The non-transitory computer-readable storage medium as described in claim 7, wherein a test program controller comprises an Application Specific Integrated Circuit (ASIC).

12. The non-transitory computer-readable storage medium as described in claim 7, wherein the asynchronous event is selected from a group consisting of:
   loading buffer memory into a test program controller, asynchronous reads by a test program controller from registers in a bridge controller, and processing fail data from connected DUTs.

13. A method for performing test site synchronization using automated test equipment (ATE), the method comprising:
   grouping a plurality of test program controllers and a plurality of bridge controllers to operate as a combined test resource, wherein each bridge controller controls a subset of the plurality of test program controllers, and wherein the plurality of bridge controllers are connected together in sequence as a chain;
   generating a first busy signal in a first bridge controller in response to a busy flag received from a test program controller connected to the first bridge controller, wherein the busy flag is raised by an asynchronous event initiated by the test program controller, and wherein each asynchronous event corresponds to a task requiring an indeterminate amount of time;
   transmitting the first busy signal downstream from the first bridge controller in sequence to remaining bridge controllers in the combined test resource, wherein the first busy signal gathers information regarding respective busy statuses of the plurality of bridge controllers;

propagating a second busy signal from a last bridge controller in the chain upstream to the first bridge controller, wherein the second busy signal is generated from the first busy signal, wherein the second busy signal comprises combined information regarding respective busy statuses of each of the plurality of bridge controllers, and wherein the second busy signal distributes the information on its way upstream to each of the plurality of bridge controllers;

transmitting the second busy signal from each of the plurality of bridge controllers to a respective test program controller in the combined test resource; and synchronizing operations of the plurality of test program controllers in the combined test resource using the second busy signal.

14. The method of claim 13, wherein the method further comprises:

under-sampling the second busy signal using a divider module, wherein each of the plurality of bridge controllers comprises a divider module; and propagating an under-sampled output of the second busy signal from a respective bridge controller to a test program controller, wherein the under-sampled output of the second busy signal is operable to perform the synchronizing.

15. The method of claim 14, further comprising:

using a global synchronization signal in conjunction with the second busy signal to perform the synchronizing, wherein the global synchronization signal is propagated to each of the plurality of test program controllers, wherein the global synchronization signal is operable to reset a respective divider module in each of the plurality of test program controllers and each half-bridge corresponding to the plurality of bridge controllers to a common clock cycle, and wherein the global synchronization signal is propagated to each of the plurality of bridge controllers.

16. The method of claim 13, further comprising:

executing a test program on a plurality of devices under test (DUTs) connected to the plurality of test program controllers in a synchronized manner in response to the synchronizing.

17. The method of claim 13, wherein a bridge controller comprises a Field Programmable Gate Array (FPGA) device.

18. The method of claim 13, wherein a test program controller comprises an Application Specific Integrated Circuit (ASIC).

19. The method of claim 13, wherein a number of test program controllers in the combined test resource is programmable and may be selected from a group consisting of: 1, 2, 3, 4, 6, and 12.

20. A system for performing test site synchronization using automated test equipment (ATE), the system comprising:

a plurality of test program controllers, wherein the test program controllers are operable to execute a test program on a plurality of connected devices under test (DUTs);

a plurality of bridge controllers, wherein the plurality of bridge controllers and the plurality of test program controllers are grouped together to operate as a combined test resource, wherein the plurality of bridge controllers are connected together in sequence as a chain, wherein each bridge controller controls a subset of the plurality of test program controllers, and wherein each of the plurality of bridge controllers is operable to:

generate a busy signal in response to busy flag received from a test program controller connected to a respective bridge controller, wherein the busy flag is raised by an asynchronous event initiated by the test program controller, and wherein each asynchronous event corresponds to a task requiring an indeterminate amount of time;

transmit a first busy signal downstream serially to subsequent bridge controllers in the chain, wherein the first busy signal gathers information regarding respective busy statuses of the plurality of bridge controllers;

propagate a second busy signal upstream to prior bridge controllers in the chain, wherein the second busy signal is generated from the first busy signal, wherein the second busy signal comprises combined information regarding respective busy statuses of each of the plurality of bridge controllers, and wherein the second busy signal distributes the information on its way upstream to each of the plurality of bridge controllers; and transmit the second busy signal to a connected test program controller, wherein the second busy is operable to synchronize operations of the plurality of test program controllers.

21. The system of claim 20, wherein the second busy signal is generated by under-sampling the first busy signal using a second clock divider circuit.

22. The system of claim 21, wherein each of the plurality of test program controllers is further operable to:

generate a third busy signal by under-sampling the second busy signal using a first clock divider circuit, wherein the third busy signal is operable to synchronize operations of the test program controller with other test program controllers in the combined test resource.

23. The system of claim 22, wherein the first clock divider circuit and the second clock divider circuit are operable to be programmed to control a magnitude of the under-sampling.

24. The system of claim 20, wherein the asynchronous event is selected from a group consisting of: loading buffer memory into a test program controller, asynchronous reads by a test program controller from registers in a bridge controller, and processing fail data from connected DUTs.

* * * * *